(12) United States Patent
    Saturley

(10) Patent No.: US 12,656,560 B2
(45) Date of Patent: Jun. 16, 2026

(54) LOW PROFILE ATTACHMENT METHOD FOR PLUGGABLE OPTICAL MODULES

(71) Applicant: Ciena Corporation, Hanover, MD (US)

(72) Inventor: Peter Vincent Saturley, Ottawa (CA)

(73) Assignee: Ciena Corporation, Hanover, MD (US)

( * ) Notice: Subject to any disclaimer, the term of this patent is extended or adjusted under 35 U.S.C. 154(b) by 254 days.

(21) Appl. No.: 18/077,716

(22) Filed: Dec. 8, 2022

(65) Prior Publication Data

US 2024/0192454 A1     Jun. 13, 2024

(51) Int. Cl.
    *G02B 6/42*      (2006.01)
    *G02B 6/38*      (2006.01)
    *H05K 7/20*      (2006.01)

(52) U.S. Cl.
    CPC ......... *G02B 6/4269* (2013.01); *G02B 6/3897* (2013.01); *G02B 6/4261* (2013.01); *H05K 7/20418* (2013.01); *H05K 7/2049* (2013.01)

(58) Field of Classification Search
    CPC .. G02B 6/4269; G02B 6/3897; G02B 6/4261; H05K 7/20418; H05K 7/2049
    USPC ........................................................ 361/688
    See application file for complete search history.

(56) References Cited

U.S. PATENT DOCUMENTS

| 7,224,582 B1 | 5/2007 | Saturley et al. |
| 7,405,931 B2 | 7/2008 | Saturley et al. |
| 9,759,235 B2 | 9/2017 | Saturley et al. |
| 10,028,407 B2 | 7/2018 | Meunier et al. |
| 10,070,553 B2 | 9/2018 | Lee et al. |
| 11,013,146 B2 | 5/2021 | Saturley et al. |
| 2011/0051373 A1* | 3/2011 | McColloch .......... G02B 6/4201 |
| | | 361/709 |
| 2012/0300403 A1* | 11/2012 | Scholeno ............. H05K 7/2049 |
| | | 361/702 |

(Continued)

FOREIGN PATENT DOCUMENTS

| DE | 202014004067 U1 * | 7/2014 | ............. H01L 23/40 |
| DE | 112016002059 T5 * | 1/2018 | ............. G06F 1/181 |
| TW | 201223003 A * | 6/2012 | .......... G02B 6/4246 |

OTHER PUBLICATIONS

Norman Quesnel, "Industry Developments: Cooling QSFP Optical Transceivers", Aug. 7, 2017, Advanced Thermal Solutions Inc., pp. 1-2 (Year: 2017).*

(Continued)

*Primary Examiner* — Mandeep S Buttar
*Assistant Examiner* — Kyle Oxenknecht
(74) *Attorney, Agent, or Firm* — Clements Bernard Walker; Christopher L. Bernard

(57)     ABSTRACT

The present disclosure relates to a module for use in a network element comprising of a circuit board and a cage mounted on the circuit board where the cage is configured to support a pluggable optical module. The circuit board including a mounted block and a riding heatsink disposed over the cage and connected to the mounting block via a low profile spring clip. The riding heatsink includes a main body and side flanges having a height less than the main body, wherein the low profile spring clip connects to the side flanges. The riding heatsink includes a plurality of fins for dissipation of heat via airflow thereover, and low-profile spring clip has a height that does not obstruct any openings between the plurality of fins.

15 Claims, 7 Drawing Sheets

(56) References Cited

U.S. PATENT DOCUMENTS

| | | | |
|---|---|---|---|
| 2014/0185988 A1* | 7/2014 | Qi | G02B 6/36 |
| | | | 29/402.03 |
| 2015/0233388 A1 | 8/2015 | Saturley et al. | |
| 2015/0342085 A1* | 11/2015 | McKervey | H05K 7/20409 |
| | | | 165/80.3 |
| 2019/0230817 A1* | 7/2019 | Han | H05K 7/20418 |
| 2020/0257067 A1* | 8/2020 | Meunier | G02B 6/4284 |
| 2021/0243915 A1 | 8/2021 | Saturley et al. | |
| 2022/0015267 A1* | 1/2022 | Bucher | H05K 7/2049 |

OTHER PUBLICATIONS

"Frequently Asked Questions", Nov. 25, 2016, OSFPmsa, p. 1 (Year: 2016).*

* cited by examiner

See Detail A

200

260

270

250

210

AIRFLOW (220)
Riding
Heatsink (230)
Spring Clip

Airflow Blocked
by Spring Clip (240)
Air Inlet Through Faceplate

DETAIL A

LOW PROFILE ATTACHMENT METHOD FOR PLUGGABLE OPTICAL MODULES

FIELD OF THE DISCLOSURE

The present disclosure generally relates to cooling via heatsinks for electrical and optical devices. More particularly, the present disclosure relates to systems and methods for a low profile heatsink attachment method for pluggable optical modules.

BACKGROUND OF THE DISCLOSURE

Explosive growth in global network connectivity driven by a multitude of factors including but not limited to new mobility services, internet of things (IoT) applications, and overall growth in users have driven a need for networking equipment being deployed with ever increasing capacity and density. This increased capacity and density produces challenges for thermal management, i.e., cooling to dissipate heat with networking equipment such as pluggable optical modules. Pluggable optical modules are optical interface devices that are connected to a Printed Circuit Board (PCB) through ports in the faceplate. Pluggable optical modules combine fiber optic transmitters and receivers (transceivers) and signal processing into a single device/module, the modules convert electrical signals into optical signals and vice versa. Pluggable optical modules are used for both telecommunication and data communication applications and are deployed throughout the world both inside and outside datacenters. Many different types of pluggable optical modules exist and are designed and implemented based on networking applications including factors such as bandwidth, form factor, optical interface, etc.

Pluggable optical modules can include C form-factor pluggable (CFP) transceivers, wherein "C" represents a 100 Gbit/s line rate, and the CFP is a hot swappable input/output (I/O) system broadly used to connect wide area networks (WAN), metropolitan networks, wireless base stations, and other optical communication systems. The CFP transceivers support the ultra-high bandwidth requirements of data communication networks that form the backbone of the internet. CFP modules are available in different sizes which include the full size CFP (82 mm wide), the half sized CFP2 (41 mm wide), and the quarter sized CFP4 (21 mm wide). These CFP modules are hot pluggable, and the faceplate port utilizes a PCB mounted cage which houses the CFP module. These pluggable optical cages are folded sheet metal enclosures that typical include an opening in the top surface where a spring loaded riding heatsink can contact the lid of the module to assist in heat rejection from the module to the environment. The cage assembly can be mounted in a 19" networking rack or similar mounting means. There does exist a CFP8 module which has a similar form factor to the CFP2 module but offers four times more bandwidth than the other CFP modules (400 Gbps, 16×25 Gbps, 8×50 Gbps).

Thermal management for high-speed optical networking equipment is a challenge especially with CFP pluggable optical modules as these devices have increased power density driven by the demand for higher bandwidth operation. In addition to CFP pluggable optical modules, pluggable optical modules can include Octal Small Form Factor Pluggable (OSFP), Quad Small Form Factor Pluggable (QSFP), QSFP+, and QSFP28 transceivers where heat rejection and heat dissipation is also a major design and implementation consideration. There exist various techniques for thermal management in networking platforms which include heatsinks, heat spreaders, airflow (fans), etc. Heatsinks or heat spreaders applied to pluggable optical modules typically include fastening to the pluggable optical cage to ensure there is good contact between the heatsink and the pluggable optical module. Airflow is designed as part of the surrounding environment in order to allow airflow across the heatsink, this can be done passively or by forcing air with fans. The problem with existing industry heat dissipation techniques for pluggable optical modules using heatsinks is that the device that is used to mount the heatsink to the pluggable optical module can impede air flow and require modification to the existing cages to function properly.

BRIEF SUMMARY OF THE DISCLOSURE

The present disclosure generally relates to cooling via heatsinks for electrical and optical devices. More particularly, the present disclosure relates to systems and methods for a low profile heatsink attachment method for pluggable optical modules. Many pluggable optical modules require a heatsink to function properly, the heatsink is typically fastened to the pluggable optical cage via a spring mechanism that ensures there is good contact between the heatsink and the device when the module is inserted. An alternative heatsink mounting method is desired that does not impede front of back airflow requirements for networking modules even in systems where very little vertical space is available. The disclosed low profile heatsink attachment method eliminates air flow blockage in front to back airflow systems, allows the re-use of existing pluggable optical module cages, and is sufficiently low profile that its use may be advantageous even with side airflow systems. In addition, the low profile heatsink attachment method does not require modification to the existing cages to function properly.

In an embodiment, a module for use in a network element includes a circuit board; a cage mounted on the circuit board, wherein the cage is configured to support a pluggable optical module; a mounting block on the circuit board; and a riding heatsink disposed over the cage and connected to the mounting block via a low profile spring clip. The riding heatsink can include a plurality of fins for dissipation of heat via airflow thereover, and low profile spring clip has a height that does not obstruct any openings between the plurality of fins. The airflow can be side to side, such that the low profile spring clip is located on at least one side of the riding heatsink and is oriented perpendicular to the airflow. The riding heatsink can include a main body and side flanges having a height less than the main body, wherein the low profile spring clip connects to the side flanges. The low profile spring clip can connect to the side flanges via screws having a height less than the main body.

The riding heatsink can include a plurality of fins for dissipation of heat via airflow thereover, and wherein the airflow is front to back. The low profile spring clip can be located on at least one side of the riding heatsink and is oriented parallel to the airflow. The low profile spring clip can be located on one or more of sides of the riding heatsink, a front of the riding heatsink, and a back of the riding heatsink, each being outside of the airflow. The low profile spring clip can be located on a side flange attached to a main body of the riding heatsink with the side flange having a height less than the main body. The low profile spring clip can include a length spanning a portion of the riding heatsink and is configured to apply pressure to the riding heatsink. The pluggable optical module can be one of a C form factor pluggable (CFP), a CFP2, a CFP4, and a CFP8. The pluggable optical module can be an octal small form factor pluggable (OSFP). The network element can include a small form factor with a height of 1 or 2 rack units (RU). The mounting block can be separate from the cage, such that attachment of the riding heat sink is independent of the cage. The cage ca be unmodified to support the riding heatsink.

In another embodiment, a method includes providing the module for use in a network element.

BRIEF DESCRIPTION OF THE DRAWINGS

The present disclosure is illustrated and described herein with reference to the various drawings, in which like reference numbers are used to denote like system components/process steps, as appropriate, and in which.

DETAILED DESCRIPTION OF THE DISCLOSURE

Figure 1:
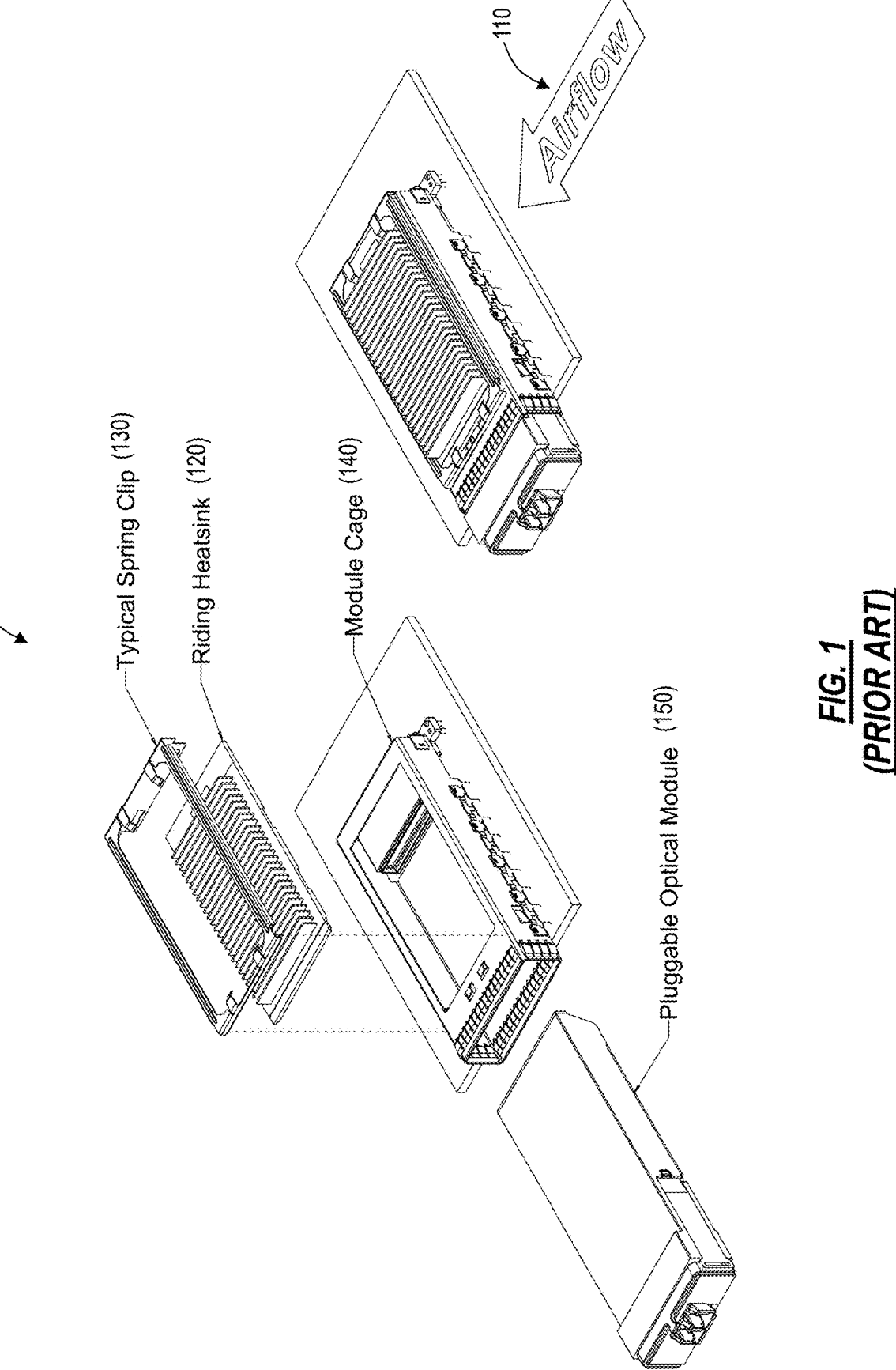
FIG. 1 is a depiction of a typical existing industry implementation for a CFP pluggable optical module including riding heatsink, spring clip, and module cage.

In various embodiments, the present disclosure relates to systems and methods for a low profile heatsink attachment method for pluggable optical modules. More particularly, the present disclosure relates to systems and methods for a low profile heatsink attachment method for pluggable optical modules. Many pluggable optical modules require a heatsink to function properly, the heatsink is typically fastened to the pluggable optical cage via a spring mechanism that ensures there is good contact between the heatsink and the device when the module is inserted. An alternative heatsink mounting method is desired that does not impede front of back airflow requirements for networking modules even in systems where very little vertical space is available. The disclosed low profile heatsink attachment method eliminates air flow blockage in front to back airflow systems, allows the re-use of existing pluggable optical module cages, and is sufficiently low profile that its use may be advantageous even with side airflow systems. In addition, the low profile heatsink attachment method does not require modification to the existing cages to function properly.

Pluggable Optical Modules

A pluggable optical module is an optical transceiver used in high bandwidth data communication and networking applications. Optical transceivers are used to manage broad-band backbone networks to help in managing traffic and implementing the backbone network for internet communications. Pluggable optical modules are optical interface devices that are connected to a PCB through ports located on the faceplate. The ports located on the faceplate connect the inside of the system to outside data through a fiber optic cable. The form factor and interfacing standards for pluggable optical modules are specified by the multi-source agreement (MSA) interest group. MSA sets standards for products to adhere to in order to ensure compatibility between multiple manufacturers. Pluggable optical modules include but are not limited to Octal Small Form Factor Pluggable (OSFP), Quad Small Form Factor Pluggable (QSFP), QSFP+, QSFP28, C Form Factor Pluggable (CFP), CFP2, CFP4 and CFP8 transceivers.

The CFP family of modules (CFP, CFP2, CFP4 and CFP8) are bidirectional devices including a transmitter, receiver, and interfaces to the network using 10×10 Gbps (gigabits per second) in each direction but can also support 4×25 Gbps. The CFP modules were primarily developed for 100 gigabit (Gbit) ethernet systems after the OSFP interface but is significantly larger to support 100 Gbit/s. Improvements to the original CFP transceivers have allowed higher performance and higher density. The CFP2 and CFP4 transceivers are electrically similar but include a smaller form factor of ½ and ¼ respectively in respect to the size of the original CFP transceiver module. The CFP8 module has a similar form factor to the CFP2 module but offers four times more bandwidth than the other CFP modules (400 Gbps, 16×25 Gbps, 8×50 Gbps).

The QSFP family of modules (QSFP, QSFP+, and QSFP28) offer a wide variety of high density and low power 40 Gbps (4×10 Gbps) ethernet connectivity options. The QSFP28 module can accept 40 Gbps and 100 Gbps ethernet (4×25 Gbps, 2×50 Gbps and 1×100 Gbps).

The OSFP module is slightly wider and deeper than the QSFP but supports 400 Gbps (8×50 Gbps). The OSFP has more power demand than the other modules that operate at lower Gbps therefore thermal performance is of great concern. The Multi Source Agreement (MSA) group recently released the OSFP 4.0 specification which defines the operation of the OSFP modules for 800 Gbps (2×400 Gbps and 8×100 Gbps).

These pluggable optical modules are often deployed in server racks including 19 inch or 23 inch wide frames where multiple modules can be included in a single or multiple rack unit height. A rack unit (RU) is defined as a unit of measure equal to 1.75 inches which defines the height of modules that are deployed in 19 inch or 23 inch rack frames which are commonly deployed for networking and telecommunication equipment. The rack unit size is based on a standard rack specification defined in EIA-310 and a typical full size rack is 42RU high where equipment is denoted in RU (1RU, 2RU, 3RU, etc.). These pluggable optical modules can be arranged in a stacked configuration in the rack where the top and bottom modules are stacked on top of one another, or the modules can be arranged in a belly to belly configuration where the bottom module is rotated 180 degrees or upside down where the underside of the modules are in close contact with one another.

The optical transceiver market is highly competitive, and growth is driven by increased traffic deriving from the internet. As the demand for higher bandwidth grows the increased power density of the pluggable optical modules also grows making it more difficult and more important to dissipate heat produced by these modules, especially in applications where pluggable optical modules are located in small form environments. The pluggable optical modules heat rejection path typically include riding heatsinks associated with the pluggable module cage and module PCB which use forced or conventional air flow around them. Selection and placement of heat rejection devices in addition to airflow and temperature optimizations are critical considerations when designing components and environments for deployment of networking systems.

<div align="center">Existing Industry Solutions to Heat Dissipation in a<br>Pluggable Optical Module</div>

FIG. 1 is a typical implementation for a CFP2 pluggable optical module 150. The CFP2 pluggable form factor was initially optimized for side-to-side chassis airflow in systems where height limitations did not require belly-to-belly mounting in 1 rack unit 110. The CFP multi-source agreement (MSA) defines hot-pluggable optical transceiver form factors to enable 40/100 G and 400 G applications and includes CFP, CFP2, CFP4, and CFP8 transceivers to support high bandwidth data networks. As defined in the MSA, a riding heatsink 120 and associated spring mechanism/clip 130 prove problematic when used in a chassis with front to back airflow. The front to back airflow is desired in many cases where the modules are mounted in networking rack frames where many racks are mounted next to one another. The riding heatsink 120 is fastened to the pluggable optical cage 140, wherein the cage houses the pluggable optical module 150. The spring clip 130 is attached at the front and rear of the cage using flanges and openings integral to the design of the pluggable optical cage 140. The spring clip 130 provides spring force to the riding heatsink 120 typically by screws and a coil spring that are screwed into a thread fastener. The riding heatsink 120 is in contact with the pluggable optical module 150 and provides thermal dissipation by ensuring good contact between the heatsink and the pluggable optical module 150. The spring clip 130 and the attachment method to the pluggable optical cage 140 can impede air flow by blocking the side to side air flow to the riding heatsink 120. In addition to impeding air flow the existing industry heat dissipation design and implementation shown (100) requires modification to the pluggable optical cage 140 to function properly. With the increasing power requirements in addition to the more densely packaged pluggable optical modules, heat dissipation methods are becoming more critical. Conventional approaches to providing adequate thermal relief of modules is to provide larger heatsinks and provide cooler air to flow across the heatsink and module. Increasing the size of the heatsink requires the availability of large physical areas around and behind the pluggable module cage 140. Considering the increasing power requirements in addition to the densely packaged forms, large heatsinks are not an option in areas where space is limited as these units are being deployed in limited component placement locations. Cooler air flow comes with a tradeoff as more power is typically required or it may not be feasible based on the density of modules in respect to one another as a small form factor is desirable.

Figure 2:
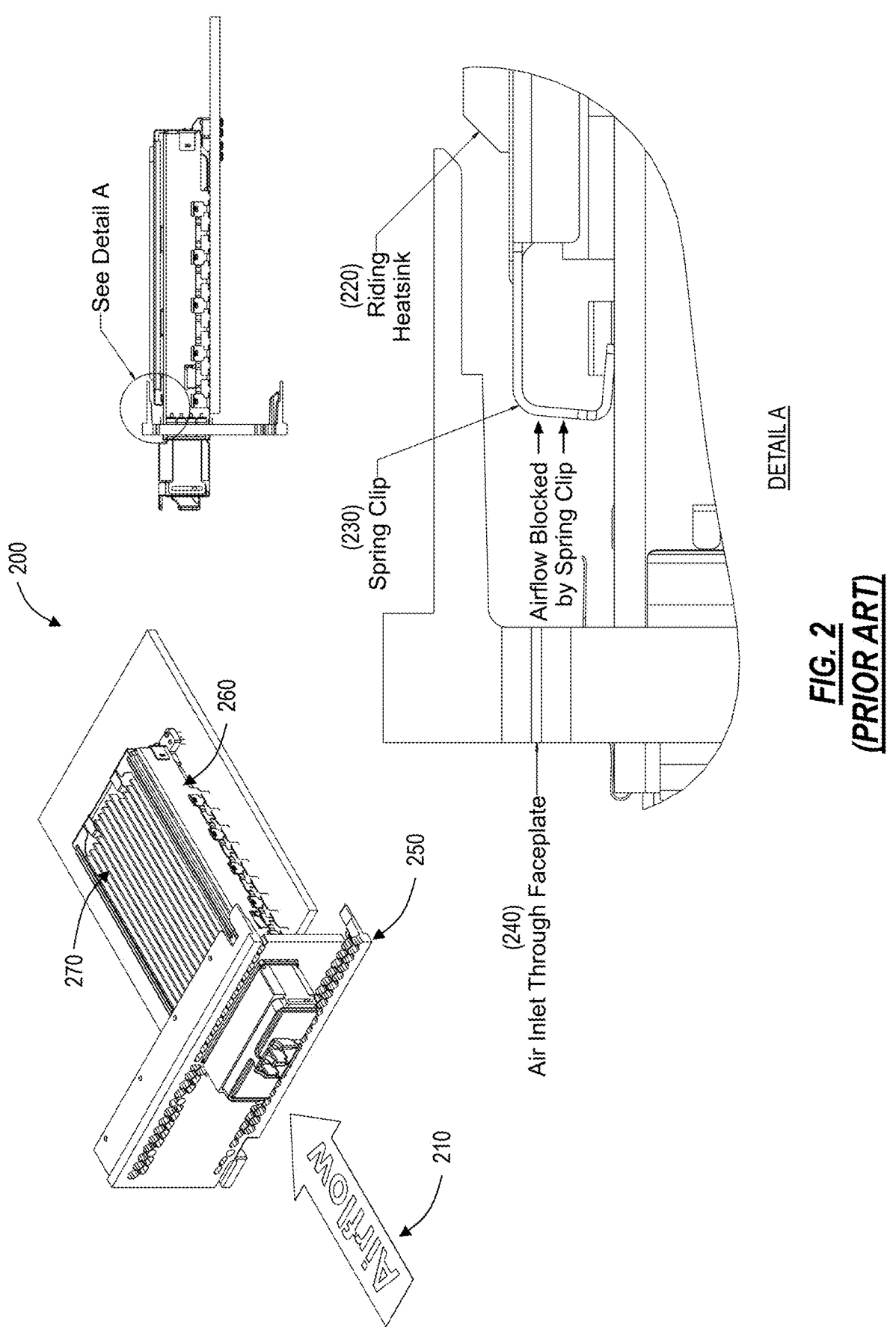
FIG. 2 is a perspective diagram of a typical existing industry CFP pluggable optical module implementation with a front inlet airflow system.

FIG. 2 is a perspective diagram of a typical CFP2 pluggable optical module implementation with a front inlet airflow system 200. Similar to the CFP module implementation shown in 100, this CFP2 module includes the module installed in an optical module cage 260 which is fastened to the Printed Circuit Board (PCB). In this illustration the pluggable optical module form factor is optimized and designed for front to back air flow 210 by utilizing a faceplate 250 designed to allow air to flow from the front to the back of the module across the riding heatsink 270. The faceplate 250 features are designed to allow the most efficient airflow and openings/perforations are designed to maximize airflow across the heatsink 270. Depending on the height of the overall module layout in the rack system the faceplate may be designed for 1RU, 2RU, etc. and can include multiple module units. The pluggable optical module with riding heatsink 270 and associated spring mechanism/clip 230 is shown assembled and mounted to a front to back airflow system. Front inlet air flow systems are becoming more common in telecommunication applications especially in rack mounted applications where racks are mounted side to side. While the typical heatsink attachment method provides only moderate blockage when applied on side to side airflow systems, the spring clip 230 provides significant blockage in a front to back airflow system where the airflow is blocked by the spring clip as air flows through the faceplate 250.

As depicted further in the side view of the module illustrated in Detail A of 200 the riding heatsink is shown 220 with associated spring clip 230. When airflow is forced through the faceplate 240 the airflow is blocked by the spring clip 230 which is used to fasten the heatsink to the top of the pluggable optical module and the heatsink is not allowed to function as intended. The air flow blockage can be so severe as to render the pluggable optical module inoperable. The air flow blockage can be overcome by using a taller heatsink, however in many applications there is limited space available for the overall footprint of the module assembly so taller heatsinks are not feasible.

<div align="center">Heat Dissipation Solution for Pluggable Optical<br>Modules</div>

Figure 3:
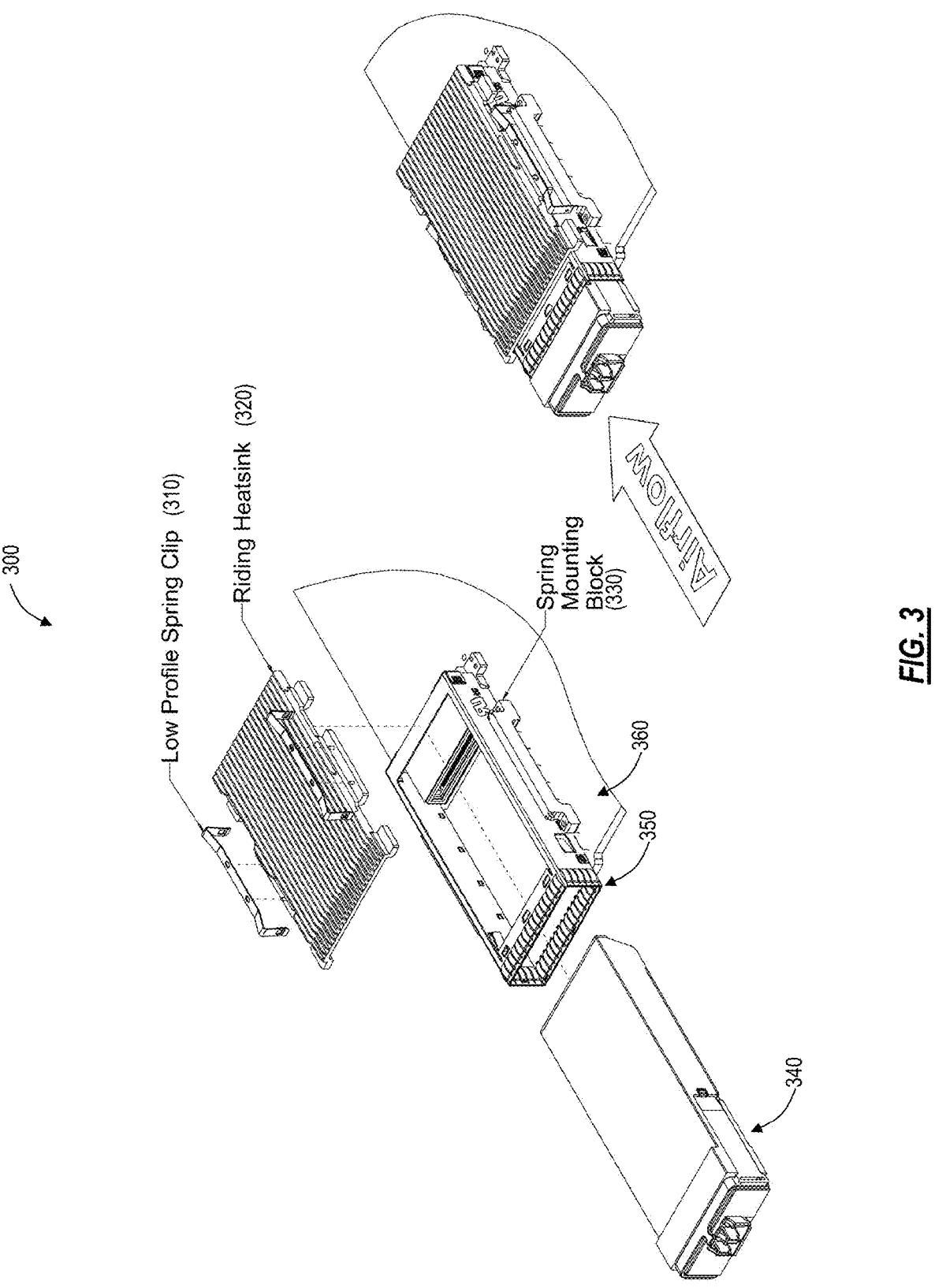
FIG. 3 is a depiction of the low profile spring clip design utilized for thermal dissipation of pluggable optical modules.

FIG. 3 is a depiction of a low profile spring clip design utilized for thermal dissipation of pluggable optical modules 300. The disclosed includes a low profile spring clip 310 that is designed to hold down the riding heatsink 320. The spring clip 310 is in contact with the riding heatsink 320 to hold it down in contact with the pluggable optical module 340. The spring clip 310 is paired with a spring mounting block 330 located on the side of the pluggable optical module 340. The spring mounting block 330 is designed to be fastened to the PCB 360, positioned beside the optical module cage 350. This low profile spring clip 310 operates independent of the pluggable optical module cage 350, where compared to the typical implementation shown in FIG. 1 where the spring clip 130 is mounted on the pluggable optical cage 140. Designing and implementing the spring clip 310 and heatsink 320 independent of the pluggable optical cage 350 allows re-using of existing optical module cages for different applications. This thermal solution does not include any spring clip 310 blockage to the front of the riding heatsink 320 as the spring clips 310 are located on the side of the riding heatsink 320. This design also allows the springs clips 310 to be mounted parallel to the sides of the cage and in a much lower position than the typical implementation 100.

Figure 4:
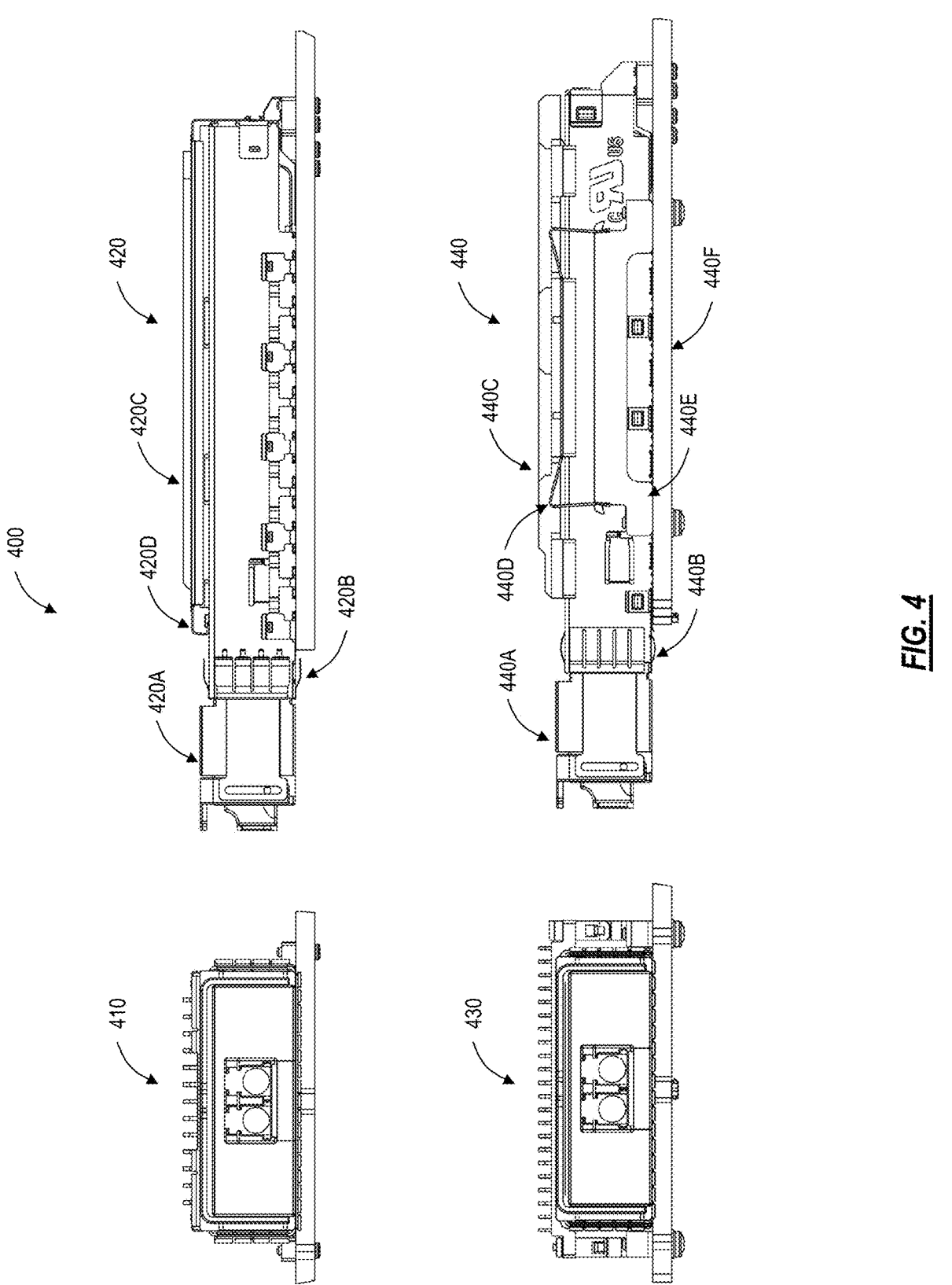
FIG. 4 is a front and side view of the pluggable optical module for the existing industry thermal dissipation solution compared to the thermal dissipation solution in the disclosed.

FIG. 4 is a front and side view of the pluggable optical module for the existing industry thermal dissipation solution compared to the thermal dissipation solution in the disclosed. The typical pluggable optical module implementation is shown with front view 410 and side view 420. This typical implementation consists of the pluggable optical module 420A, the pluggable optical cage 420B, the riding heatsink 420C, and spring clip 420D. In this typical implementation airflow is blocked from getting to the riding heatsink 420C by the spring clip 420D especially when the system is designed for front to back airflow. The blocking of the air flow can be further seen on 410 where the riding heatsink fins are shown blocked by the spring clip. The riding heatsink 420C could be made taller to account for the blockage of the air flow but that would increase the height of the pluggable optical module which is not desirable for low profile applications. Also, it is not optimal design to make the riding heatsink 420C any bigger than absolutely necessary for proper thermal dissipation and heat rejection.

The thermal dissipation solution presented in the disclosed is shown with front view 430 and side view 440. This implementation consists of the pluggable optical module 440A, the pluggable optical cage 440B, the riding heatsink 440C, the spring clip 440D, and a spring mounting block 440E. In this implementation front to back and side to side airflow is optimized on the riding heatsink 440C as the heatsink is not blocked by the spring clip 440D. The spring clip 440D is located on the side of the pluggable optical cage 440B and attaches to a spring mounting block 440E which is mounted beside the pluggable optical module cage 440B fastened to the PCB 440F. The spring clip 440D is low profile and smaller form than the typical industry solution 420D and the result is more surface area of the riding heatsink 440C exposed for air flow. As further shown in the front view 430 when front to back air flow implementation is designed the blockage that occurs from a typical spring clip is eliminated as all the heatsink fins are exposed for air flow.

Figure 5:
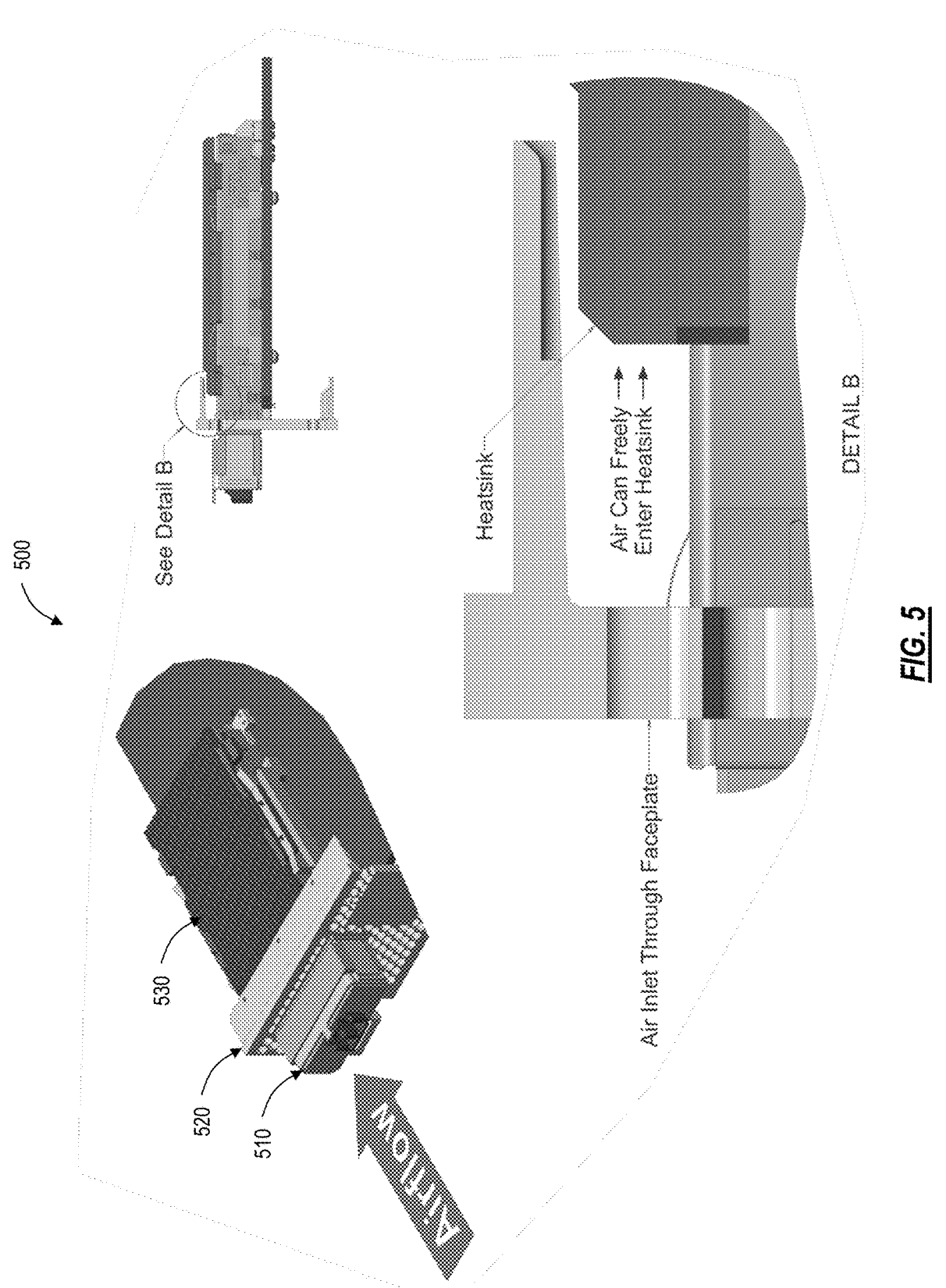
FIG. 5 illustrates how air flows with the low profile clip implemented on a pluggable optical module in a front to back airflow system.

FIG. 5 illustrates how air flows with the low profile clip implemented on a pluggable optical module in a front to back airflow system 500. The pluggable optical module 510 is implemented with a faceplate 520 wherein the faceplate is designed to allow air to flow from front to back through the vented faceplate 520 and across the riding heatsink 530. In this implementation the airflow blockage that exists with the typical industry solution at the riding heatsink 530 is eliminated resulting in significantly improved airflow. The riding heatsink 530 redirects heat away from the pluggable optical module 510 by having the heatsink thermal conductor in contact with the pluggable optical module 510 and using the air flow across the riding heatsink surface area fins to provide cooling and thermal dissipation. In this low profile heatsink implementation air can freely enter the riding heatsink 530.

Figure 6:
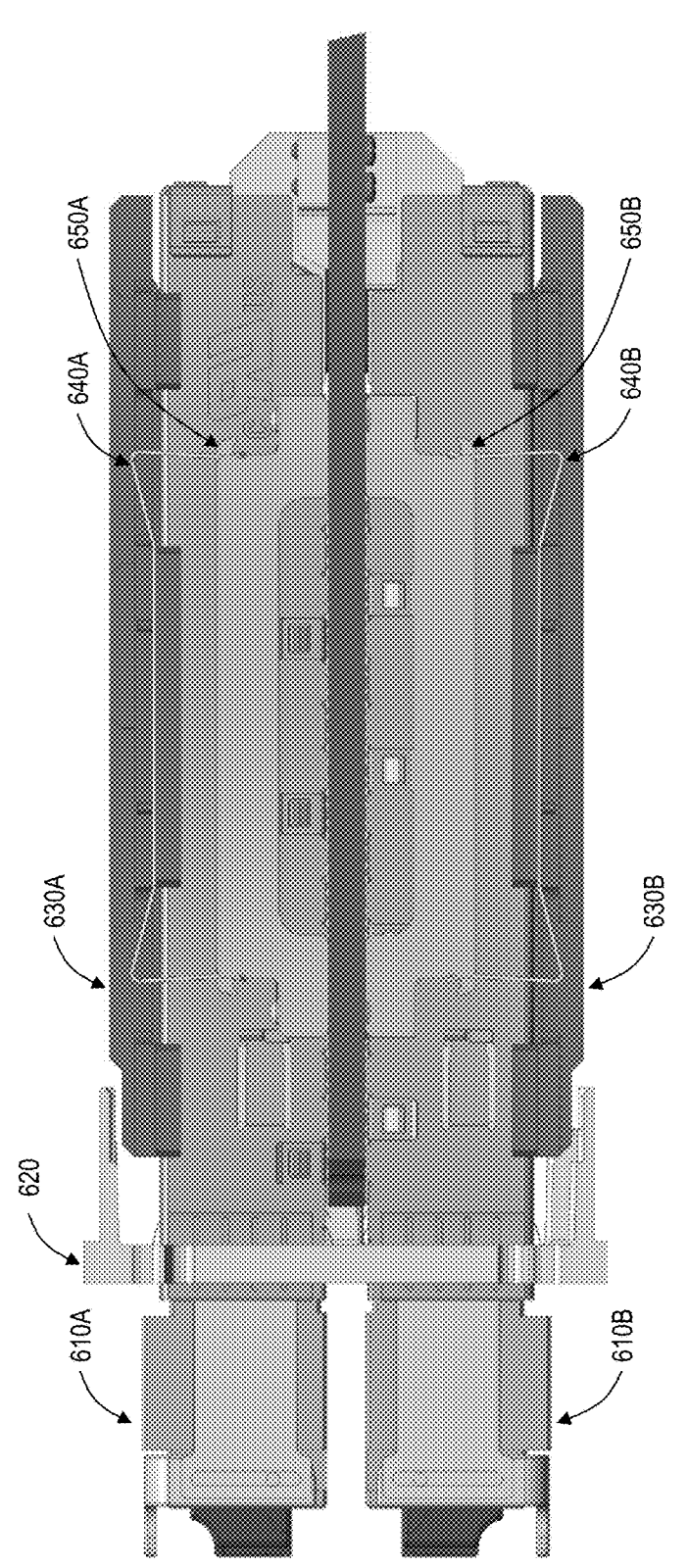
FIG. 6 is a side view of two pluggable optical modules with the low profile thermal dissipation solution assembled in a belly to belly orientation 600.

FIG. 6 is a side view of two pluggable optical modules with the low profile thermal dissipation solution assembled in a belly to belly orientation 600. The orientation shown consists of two pluggable optical modules (610A, 610B) where the bottom pluggable optical module 610B rotated 180 degrees to the horizontal plane where the belly or bottom of the pluggable module cages are in near contact with one another. The riding heatsinks (630A, 630B) are on opposing sides, but the two modules are mounted on a vented faceplate 620 which allows the air to flow from the front of the pluggable optical modules to the back. The spring clips 640A, 640B are shown attached to the spring mounting block 650A, 650B. The low profile spring clips 640A, 640B connect to the side flanges via screws having a height less than the main body. With a belly to belly arrangement the modules can utilize the same heatsink configuration and modification of the pluggable module cages are not required. The advantage of the belly to belly arrangement is it creates an independent and uniform cooling approach between the top and bottom modules. The heat dissipation design presented 600 makes efficient use of available limited height and allows for belly to belly deployment in form factors as small as one (1) rack unit. A rack unit (RU) is defined as a unit of measure equal to 1.75 inches (44.45 mm) which defines the height of modules that are deployed in 19 inch or 23 inch rack frames which are commonly deployed for networking and telecommunication equipment. The rack unit size is based on a standard rack specification defined in EIA-310 and a typical full size rack is 42RU high where equipment is denoted in RU (1RU, 2RU, 3RU, etc.). Rack units can be mounted in a side to side lineup wherein the best air flow option is front to back as side to side airflow is not practical.

Figure 7:
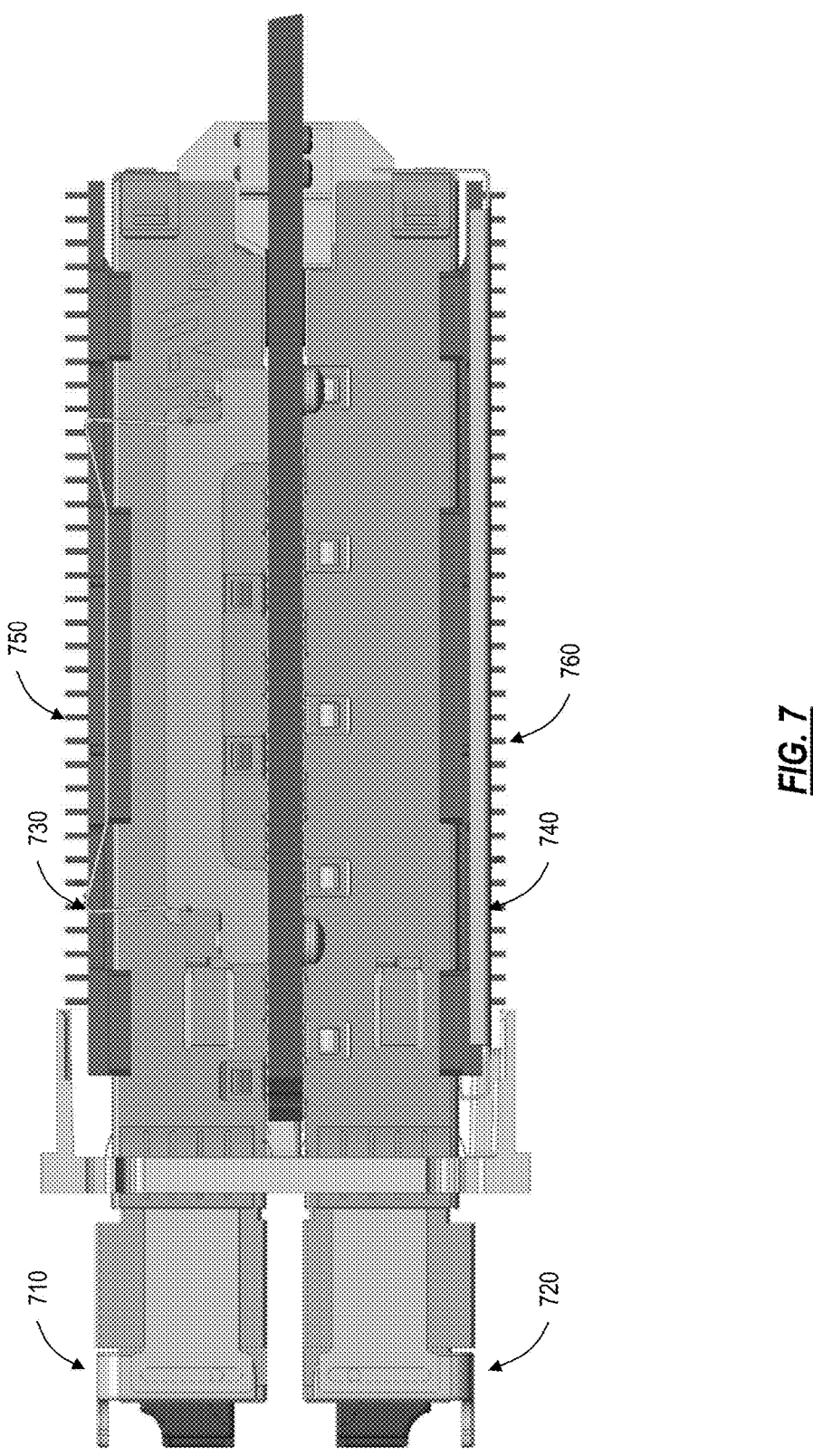
FIG. 7 is a side view of two pluggable optical modules with the top module having the low profile thermal dissipation solution and the bottom having the existing industry thermal dissipation solution.

FIG. 7 is a side view of two pluggable optical modules with the top module 710 having the low profile thermal dissipation solution and the bottom module 720 having the existing industry thermal dissipation solution. The low profile clip 730 positioning in relation to the heatsink and the low profile form is such that much less airflow blockage results. The airflow exposure is evident as shown in 700 where the top module heatsink fins 750 have much better exposure to the side to side air flow. The heatsink fins 760 on the bottom module which include the existing industry thermal dissipation solution has much more blockage from the spring clip 740.

In addition to the air flow benefits that are a result of the low profile attachment method disclosed, the use of a separate spring mounting block separated from the optical module cage allows this solution to be utilized with existing pluggable optical cage designs. This low profile design and implementation is critical for high power and/or low profile designs which are being driven by an ever increasing power demand driven by higher bandwidth environments. The attachment of the heatsink is independent of the cage geometry, and thus it can be implemented on existing cages without modification. The low profile spring clip is located on a side flange attached to a main body of the heatsink and connects to the heatsink side flanges via screws having a height less than the main body.

In an embodiment the pluggable optical module 340 is inserted inside an optical cage 350 where the cage is configured to support the pluggable optical module. The components of the low profile heat sink attachment method include a mounting block 330 mounted on the PCB 360 and positioned beside the optical module cage 350 and a riding heatsink 320 disposed over the cage and connected to the mounting block via a low profile spring clip 310. The heatsink 320 includes a plurality of fins for dissipation of heat via airflow and the low profile spring clip 310 has a height that does not obstruct any openings between the plurality of fins. The riding heatsink 320 includes a main body and side flanges having a height less than the main body where the low profile spring clip 310 connects to the side flanges. The low profile spring clip 310 includes a length spanning a portion of the riding heatsink 320 and is configured to apply pressure to the riding heatsink 320. The spring mounting block 330 is separate from the optical module cage 350 such that attachment of the riding heatsink is independent of the optical module cage 350. The optical module cage 350 is also unmodified to support the riding heatsink 320 as the spring mounting block 330 and the low profile spring clip 310 are independent of the optical module cage 350.

The pluggable optical module can be CFP, CFP2, CFP4, CFP8, OSFP or other small form factor. The low profile heatsink and spring clip is well suited for mounting in a rack mounted frame and optimizes heat dissipation for front to back airflow in addition to side to side airflow. The low profile spring clip 310 can connect to the heatsink side flanges via screws having a height less than the main body of the heatsink. The low profile spring clip 310 when attached to the spring mounting block 330 is located on the side of the riding heatsink with a very small overall size which eliminates blockage of airflow when implemented with front to back airflow systems and greatly reduces blockage when implemented with side to side airflow systems.

Conclusion

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, at least one processor, circuit/circuitry, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by one or more processors (e.g., any type of programmable circuitry or logic) that, in response to such execution, cause the one or more processors to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements, operations, steps, methods, processes, algorithms, functions, techniques, etc. described herein can be used in any and all combinations with each other.

What is claimed is:

1. A module for use in a network element, the module comprising:
   a circuit board;
   a cage mounted on the circuit board, wherein the cage is configured to support a pluggable optical module;
   a mounting block fastened directly to the circuit board beside the cage; and
   a riding heatsink including a main body, a side flange extending outwards from the main body and downwards from the main body beside the cage, the side flange being disposed outside of and below an upper surface of the cage, and a plurality of fins extending from the main body for dissipation of heat via airflow therethrough disposed over the cage and connected to the mounting block via a low profile spring clip, wherein the side flanges has a height less than the main body, wherein the low profile spring clip connects to the side flange below a height of the main body, and wherein neither the mounting block nor the low profile spring clip block the airflow into any openings between the plurality of fins.

2. The module of claim 1, wherein the low profile spring clip has a height that does not block the airflow into any of the openings between the plurality of fins.

3. The module of claim 2, wherein the airflow is side to side, such that the low profile spring clip is located on at least one side of the riding heatsink and is oriented perpendicular to the airflow.

4. The module of claim 1, wherein the low profile spring clip connects to the side flange via a screw having a height less than the main body.

5. The module of claim 1, wherein the airflow is front to back.

6. The module of claim 5, wherein the low profile spring clip is located on at least one side of the riding heatsink and is oriented parallel to the airflow.

7. The module of claim 5, wherein the low profile spring clip is located on the at least one side of the riding heatsink such that the low profile spring clip does not block the airflow into any of the openings between the plurality of fins.

8. The module of claim 1, wherein the low profile spring clip includes a length spanning a portion of the riding heatsink and is configured to apply pressure to the riding heatsink.

9. The module of claim 1, wherein the pluggable optical module is one of a C form factor pluggable (CFP), a CFP2, a CFP4, and a CFP8.

10. The module of claim 1, wherein the pluggable optical module is an octal small form factor pluggable (OSFP).

11. The module of claim 1, wherein the mounting block is separate from the cage, such that attachment of the riding heat sink to the circuit board is independent of the cage.

12. A method comprising providing a module for use in a network element, the module including
   a circuit board;
   a cage mounted on the circuit board, wherein the cage is configured to support a pluggable optical module;
   a mounting block fastened directly to the circuit board beside the cage; and
   a riding heatsink including a main body, a side flange extending outwards from the main body and downwards from the main body beside the cage, the side flange being disposed outside of and below an upper surface of the cage, and a plurality of fins extending from the main body for dissipation of heat via airflow therethrough disposed over the cage and connected to the mounting block via a low profile spring clip, wherein the side flanges has a height less than the main body, wherein the low profile spring clip connects to the side flange below a height of the main body, and wherein neither the mounting block nor the low profile spring clip block the airflow into any openings between the plurality of fins.

13. The method of claim 12, wherein the low profile spring clip has a height that does not block the airflow into any of the openings between the plurality of fins.

14. The method of claim 12, wherein the airflow is front to back.

15. The method of claim 12, wherein the low-profile spring clip includes a length spanning a portion of the riding heatsink and is configured to apply pressure to the riding heatsink.

\* \* \* \* \*